United States Patent [19]

Elfner et al.

[11] 4,358,734
[45] Nov. 9, 1982

[54] METHODS AND APPARATUSES FOR DETECTING THE SPEED OF AN ASYNCHRONOUS MOTOR

[75] Inventors: Bo A. Elfner; Anders P. P. Comstedt, both of Löddeköpinge, Sweden

[73] Assignee: EL-FI Innovationer AB, Helsingborg, Sweden

[21] Appl. No.: 246,946

[22] Filed: Mar. 24, 1981

[30] Foreign Application Priority Data

Mar. 26, 1980 [SE] Sweden ............................ 8002310

[51] Int. Cl.³ .................................................. G01P 3/56
[52] U.S. Cl. ...................................... 324/161; 318/312
[58] Field of Search .................. 324/161, 163; 318/52, 318/66, 312, 329

[56] References Cited

U.S. PATENT DOCUMENTS 4,194,129  3/1980  Dumbeck ........................ 324/161 X

FOREIGN PATENT DOCUMENTS 550527  11/1956  Italy ..................................... 324/161

OTHER PUBLICATIONS

Zimmerman, Measuring Frequency Deviation, Electronic Industries, Jun. 1965, pp. 100, 101, 107.

Primary Examiner—Stanley T. Krawczewicz
Attorney, Agent, or Firm—Cushman, Darby & Cushman

[57] ABSTRACT

For determining the speed of an asynchronous motor use is made of the most manifest tone in the frequency spectrum beneath an overtone to the basic tone of the motor current. The frequency difference between the overtone and the tone in the subjacent frequency spectrum is determined, and thereby the slip and speed of the motor can also be established.

9 Claims, 5 Drawing Figures

METHODS AND APPARATUSES FOR DETECTING THE SPEED OF AN ASYNCHRONOUS MOTOR

The present invention relates to a method and apparatus for detecting the speed of an asynchronous motor.

In conjunction with the production of a new type of motor protection, intended to protect asynchronous motors from overheating, the detection of the motor speed has proved to be necessary. In this context, it is also desirable to avoid such speed detectors as require separate lines to the motor.

The object of the present invention is, therefore, to realize a method and apparatus for speed detection which satisfy the above-disclosed need, that is to say do not require any separate lines to the motor.

According to the invention, the spectrum of overtones prevailing in the motor current is utilized and, more precisely, components of the motor current in one frequency band beneath an overtone to the fundamental or basic tone of the motor current are separated, the frequency difference between the overtone and at least one of these components is determined and the slip, and thereby the speed, of the motor is determined from the frequency difference.

The apparatus for carrying out the method according to the present invention is characterised by a band pass filter for separating components of the motor current in one frequency band below an overtone to the basic tone of the motor current, and circuitry for determining the slip, and thereby the speed, of the motor, from the frequency difference between the overtone and at least one of said motor current components.

The nature of the present invention and its aspects will be more readily understood from the following brief description of the accompanying drawings, and discussion relating thereto.

In the accompanying drawings:

FIG. 1 schematically illustrates the frequency spectrum of the motor current of an ansynchronous motor;

FIG. 2 illustrates one embodiment of the detection apparatus according to the invention;

FIG. 3 schematically illustrates a second embodiment of the detection apparatus according to the invention;

Figure 1:
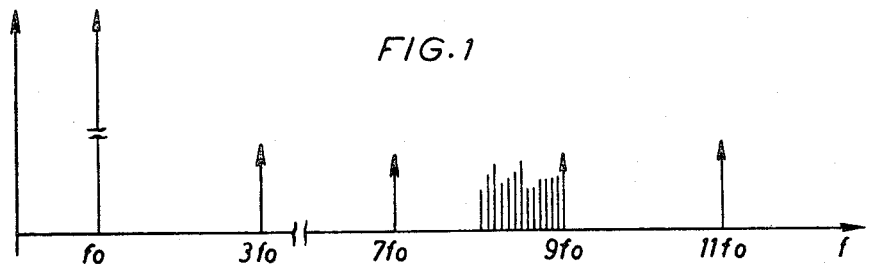

As is schematically illustrated in FIG. 1, the motor current in an asynchronous motor comprises, apart from the actual basic tone $f_o$, normally 50 Hz, also the odd overtones, that is to say $m \cdot f_o$; $m = 3, 5, 7, 9 \ldots$. These overtones are, naturally, of a considerably lower amplitude than the basic tone. With even lower amplitude there is, under each overtone, a spectrum of other tones; shown on the drawing solely under the overtone $9f_o$. These components of the motor current arise as a result of the presence of iron and of the geometry of the grooves in the motor. The non-linear magnetic properties of the iron give rise, thus, to overtones to the basic tone, the mains frequency, of the stator, as well as to the basic tone of the rotor which consists of the mains frequency multiplied by the slip. In the spectrum present under an overtone, the frequency difference vis-à-vis the overtone is of the form $n \cdot s \cdot f_o$, $n = 1, 2, 3, \ldots$, where s is the slip. The most manifest of these components is the one having $n = 10$ or $n = 14$, respectively. For $n > 20$, the amplitude is slight in relation to the lower values of n.

In practice, the present invention has gained advantage from the above-outlined situation by determining the slip from the above-mentioned frequency difference, whereby the speed of the motor is given. Thus, the frequency difference may be measured between the present overtone to the stator frequency and the most manifest tone in the spectrum immediately beneath the present overtone.

Figure 2:
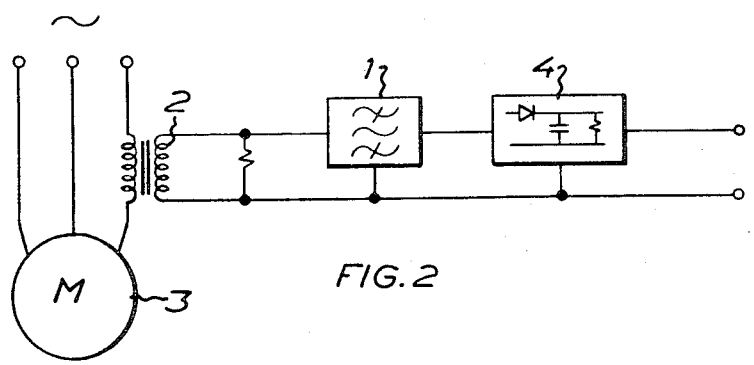

The embodiment, shown in FIG. 2, of the detection apparatus according to the invention is provided with a band pass filter 1 which, by means of a current transformer 2, is supplied with a signal which corresponds to the current to the stator winding of a three-phase motor 3. The output of the band pass filter 1 is connected to an envelope detector 4 which is thereby provided with a signal of frequencies within a selected frequency band which lies beneath and also includes a selected overtone to the stator frequency. On its output, the detector 4 emits a signal which corresponds to the envelope of the output signal from the band pass filter 1.

Since the envelope frequency is, in a predeterminable manner, related to the slip, the speed N of the motor 3 may readily be determined from the relationship: $N = N_1(1-s)$, wherein $N_1$ is the synchronous speed (rpm).

Figure 3:
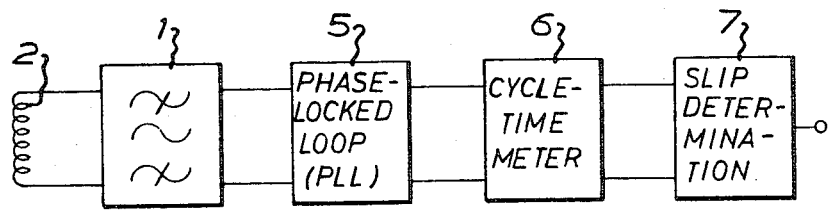

As is illustrated in FIG. 3, a phase-locked loop 5 can be connected to the output of the band pass filter 1, instead of the envelope detector 4 illustrated in FIG. 2. The phase-locked loop 5 locks onto the frequency of the greatest amplitude. A cycle or period time meter 6 coupled to the output of the phase-locked loop is operative to measure, in a manner known in the art, the duration of the period of the frequency on which the phase-locked loop 5 has locked. The circuit stage 7 connected after the period meter 6 carries out, on the basis of the period of the overtone in question and on the basis of the period determined in the period meter 6, a determination of the slip s and thereby of the speed of the motor.

In the case when two or more tones have substantially the same amplitude in the spectrum passed by the band pass filter 1, the measurement, in the embodiment of FIG. 3, is based on the signal component having the greatest n. As a result, but a relative measurement of the slip or deviation from synchronous speed will be obtained. An absolute determination of the speed requires, in this case, the determination of n for the component in question which may be effected by some form of frequency analysis of the studied spectrum. Alternatively, measurement data on the current and calculated speed may be compared with the rated data of the motor.

As a third alternative embodiment, the time-variable signal from the band pass filter 1 can be impressed upon a device which is operative to carry out so-called Fast Fourier Transform, whereby there will be obtained a transfer to the frequency plane, and the frequency differences in question, as well as the slip and the speed of the motor, may readily be calculated.

Figure 4:
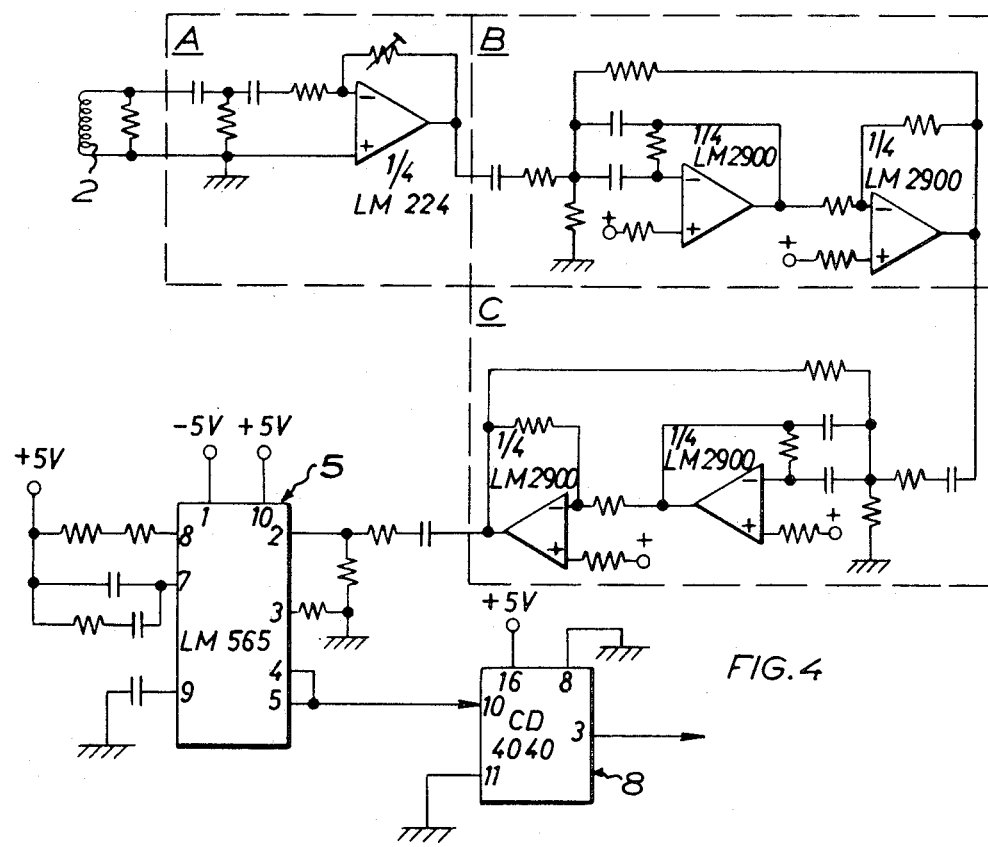
FIG. 4 is a circuit diagram of parts of the apparatus of FIG. 3.
Figure 5:
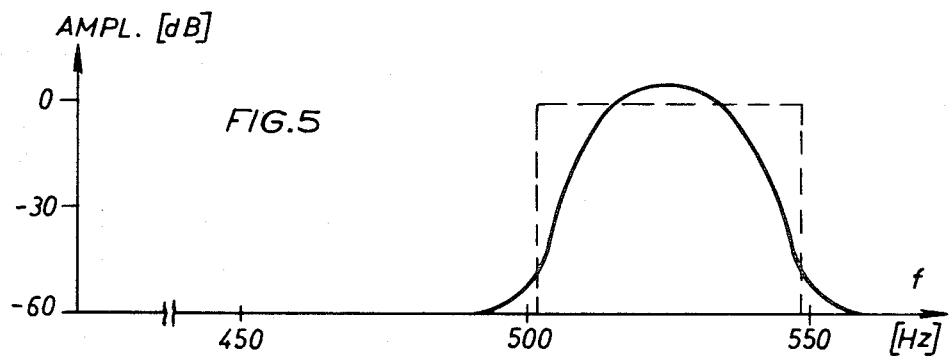
FIG. 5 shows an example of a desired characteristic of a band pass filter included in the apparatus.

FIG. 4 illustrates a preferred embodiment of the band pass filter 1 and the phase-locked loop 5 of FIG. 3. The band pass filter 1 consists of three cascade-coupled filter units A, B and C, of which the unit A consists of a passive band filter and a subsequent buffer amplifier whose purpose is to remove the basic tone (50 Hz), which otherwise would, as a result of its great amplitude, dominate the subsequent circuits. The units B and C constitute active band pass filter units with slightly different central frequencies, whereby a frequency characteristic will be achieved for the units A, B and C together, this characteristic constituting a good approximation of a desired characteristic, as shown in FIG. 5.

As will be apparent from FIG. 5, the desired frequency characteristic is such that it allows the passage of frequencies below the overtone 11·50 Hz=550 Hz, and above the overtone 10·50 Hz=500 Hz. The attenuation on either side of the pass band is as high as 60 dB.

The output of the filter unit C is coupled to the input to a phase-locked loop 5 which is made up of an integrated standard circuit of the LM565 type with outer components for signal adaptation on the input and for adjustment of the free oscillation frequency, that is to say the frequency at which the loop 5 oscillates when no sufficiently powerful signal is present on its input. The free oscillation frequency is adjusted such that it lies above the pass band in question (approx. 560 Hz).

The output of the phase-locked loop 5 is connected to the input to a frequency divider 8 for example of the CD4040 type which divides the frequency of the input signal by the factor 32. Thereby, the output signal from the frequency divider 8 has a period time which is 32 times longer than the period time of the input signal and is thereby correspondingly easier to determine with the desired degree of accuracy.

The period measurement proper in which the frequency division can be seen as a preparatory or first measure, can, like the conversion of the slip value, either be carried out by means of discrete circuits or by means of a suitably programmed computer.

We claim:

1. A method for detecting the speed of an asynchronous motor, wherein components of the motor current in one frequency band beneath an overtone to the basic tone of the motor current are separated, wherein the frequency difference between the overtone and at least one of said components is determined, and wherein the slip, and thereby the speed of the motor, is determined from the frequency difference.

2. The method as recited in claim 1, wherein said components are separated by means of a band pass filter.

3. The method as recited in claim 1 or 2, wherein the frequency difference is determined by means of an envelope detector on the basis of a beat frequency between the overtone and one of said components.

4. The method as recited in claim 1 or 2, wherein the frequency difference and slip are determined by means of circuitry coupled after the band pass filter and comprising, in series, a phase-locked loop, a period meter and a period time-to-slip converter.

5. The method as recited in claim 1 or 2, wherein the frequency difference is determined by frequency analysis, preferably based on Fast Fourier Transform of said components.

6. An apparatus for carrying out the method as recited in claim 1, for detecting the speed of an asynchronous motor, comprising a band pass filter (1) for separating components of the motor current in one frequency band beneath an overtone to the basic tone of the motor current, and circuitry (4; 5-7) for determining the slip, and thereby the speed of the motor, from the frequency difference between the overtone and at least one of said motor current components.

7. The apparatus as recited in claim 6, wherein said circuitry comprises an envelope detector (4) coupled to the output of said band pass filter.

8. The apparatus as recited in claim 6, wherein said circuitry comprises, in series after said band pass filter, a phase-locked loop (5), a period meter (6) and a period time-to-slip converter (7).

9. The apparatus as recited in claim 6, wherein said circuitry further includes means for executing frequency analysis, preferably based on Fast Fourier Transform of said components.

* * * * *